(12) United States Patent
Zhang et al.

(10) Patent No.: US 8,864,121 B2
(45) Date of Patent: Oct. 21, 2014

(54) ADAPTIVE CLAMP WIDTH ADJUSTING DEVICE

(75) Inventors: Xiang Bao Zhang, Singapore (SG); Siew Hua Ng, Singapore (SG); Teck Keong Boh, Singapore (SG); Kim Mone Kwong, Singapore (SG)

(73) Assignee: Manufacturing Integration Technology Ltd, Singapore (SG)

( * ) Notice: Subject to any disclaimer, the term of this patent is extended or adjusted under 35 U.S.C. 154(b) by 958 days.

(21) Appl. No.: 12/999,311

(22) PCT Filed: Jun. 18, 2009

(86) PCT No.: PCT/SG2009/000219
§ 371 (c)(1),
(2), (4) Date: Jan. 9, 2011

(87) PCT Pub. No.: WO2009/154578
PCT Pub. Date: Dec. 23, 2009

(65) Prior Publication Data
US 2011/0095467 A1    Apr. 28, 2011

(30) Foreign Application Priority Data
Jun. 18, 2008    (SG) .............................. 200804658-3

(51) Int. Cl.
*B25B 1/06* (2006.01)
*H01L 21/687* (2006.01)
*H01L 23/544* (2006.01)

(52) U.S. Cl.
CPC ..... *H01L 21/687* (2013.01); *H01L 2223/54486* (2013.01); *H01L 23/544* (2013.01)

USPC ......................................................... 269/216

(58) Field of Classification Search
USPC ............ 269/57, 216, 225, 910; 206/701, 712, 206/725
See application file for complete search history.

(56) References Cited

U.S. PATENT DOCUMENTS

| 533,499 | A | * | 2/1895 | Schleicher | 269/107 |
| 1,885,335 | A | * | 11/1932 | Dilas | 223/20 |
| 2,985,048 | A | * | 5/1961 | De Hart | 269/83 |
| 3,063,708 | A | * | 11/1962 | Wollenhaupt | 269/216 |
| 3,704,879 | A | * | 12/1972 | Nishikawa | 269/222 |

(Continued)

OTHER PUBLICATIONS

International Search Report for PCT/SG2009/000219 from Australian Patent Office completed on Sep. 18, 2009 and mailed Sep. 23, 2009 (3 pages).

*Primary Examiner* — Lee D Wilson
*Assistant Examiner* — Jamal Daniel
(74) *Attorney, Agent, or Firm* — Pyprus Pte Ltd

(57) ABSTRACT

The present invention describes an adaptive clamp width adjusting device (200) for use in an integrated circuit package process machine. The device (200) includes a travel component (210) and a fixed component (310). The travel component (210) carries a clamp (220a,220b) with an adjustable width and a rotary screw (230a) operable for such adjustment by a driven wheel (232). The fixed component (310), mounted on a base plate (312), includes a motor (320) and a drive wheel (324) attached to the motor shaft. When the device (200) is in a clamp width conversion station (40a), the travel component (210) is aligned above the fixed component (310) so that when the base plate (312) is raised and the drive wheel (324) engages the driven wheel (232), the clamp width is operable to be adjusted by the motor (320) according to a width of a workpiece (W).

13 Claims, 6 Drawing Sheets

(56) References Cited

U.S. PATENT DOCUMENTS

| | | | |
|---|---|---|---|
| 4,753,427 A * | 6/1988 | Lodrick, Sr. | 269/185 |
| 4,770,401 A * | 9/1988 | Donaldson | 269/249 |
| 5,372,972 A | 12/1994 | Hayashi et al. | |
| 5,746,422 A | 5/1998 | Harada et al. | |
| 5,853,214 A * | 12/1998 | Babbs et al. | 294/161 |
| 6,958,917 B2 | 10/2005 | Suhara | |
| 7,155,299 B2 | 12/2006 | Yong et al. | |
| 7,569,840 B2 | 8/2009 | Harada et al. | |
| 8,246,027 B2 * | 8/2012 | Li et al. | 269/225 |

\* cited by examiner

ADAPTIVE CLAMP WIDTH ADJUSTING DEVICE

FIELD OF INVENTION

The present invention relates to an adaptive clamp width adjusting device. In particular, the invention relates to a clamp adaptive for holding a range of leadframe strips during processing of semiconductor integrated circuits.

BACKGROUND

Manufacture of semiconductor integrated circuits is gearing towards surface mount technology, in which, integrated circuits are formed in packages that are then singulated into individual devices. Examples of these packages are ball grid arrays (BGA) and chip scale packages (CSP). These integrated circuits are often formed on a leadframe or substrate. For example, the leadframes/substrate comes in strips and may vary in widths from about 25-80 mm and lengths from about 140-270 mm.

These packages are often tested and laser marked before being delivered; these machines are generally automated and they process thousands of packages or strips an hour. For a machine to handle a range of semiconductor packages, the handler and associated clamps must accommodate a range of widths of leadframes on which the packages are removeably mounted. Currently, some machine suppliers provide a change kit for each package type and/or leadframe/substrate; when a machine is configured to handle a particular package and/or leadframe, the machine's handler is equipped with a change kit that has a clamping unit associated with the particular package and/or leadframe. A disadvantage of changing the handler with a change kit is that it takes manual effect and time to carrying out the change. Human intervention may introduce errors following the change.

In one approach, U.S. Pat. No. 6,958,917, assigned to Fuji Machine Mfg., Ltd., describes a fragile substrate holding device. The holding device has a contact portion of a receiving member and moveable member being made of an elastically deformable material such as rubber. The holding device may also have a velocity reducing device.

It can thus be seen that there exists a need for a simple and robust device to adaptively hold or clamp the leadframe/substrate of integrated circuit packages during manufacture. Preferably, the clamp device is automated and dispenses with human intervention.

FIG. 1 shows a conventional laser marking machine 5. As shown in FIG. 1, the laser marking machine 5, similar to that illustrated in U.S. Pat. No. 7,155,299, issued to the present assignee, includes an input pick-and-place handler 10 operable in a Y-direction to pick a strip of integrated circuit (IC) package W one at a time from an input magazine 20. Each IC package W is then moved to an input station 40 of a conveyor 30. At the input station 40 is a clamping device 42 for holding the IC package for it to be moved along the conveyor 30. As shown in FIG. 1, the conveyor 30 consists of three sections, namely, an input track 32, a marking track 34 and an output track 36.

Along the marking track 34 is a pre-marking inspection station 50, a laser marking station 52 and a post-marking inspection station 54. The processed IC packages W are then transferred to an output station 60 on the output track 36. At the output station 70 is an output pick-and-place handler 80 operable to move the processed IC packages W to an output magazine 70.

SUMMARY

The following presents a simplified summary to provide a basic understanding of the present invention. This summary is not an extensive overview of the invention, and is not intended to identify key features of the invention. Rather, it is to present some of the inventive concepts of this invention in a generalised form as a prelude to the detailed description that is to follow.

The present invention seeks to provide a new pallet for an integrated circuit process machine. The pallet comprises a substrate clamp, which has an adaptive clamp width adjusting or setting device to hold a substrate having a range of widths.

In one embodiment, the present invention provides an adaptive clamp width setting device. The device comprises a travel component and a fixed component. The travel component comprises a fixed clamp portion, an adjustable clamp portion and a rotary screw for adjusting a distance between the fixed and adjustable clamp portions, with the rotary screw being operable by a driven wheel attached thereto. The fixed component comprises a base plate and a motor mounted on the base plate, with the motor shaft having a drive wheel attached thereto. When the clamp width is to be adjusted or set to accommodate a workpiece, the travel component is moved into alignment over the fixed component and the base plate is raised so that the drive wheel engages with the driven wheel and the distance between the fixed and moveable clamp portions is operatively adjusted by controlling the motor according to a width of the workpiece.

In another embodiment, the present invention provides an integrated circuit process machine comprising an adaptive clamp width setting device. The process machine comprises a laser marking machine and/or a testing machine.

BRIEF DESCRIPTION OF THE DRAWINGS

This invention will be described by way of non-limiting embodiments of the present invention, with reference to the accompanying drawings, in which.

DETAILED DESCRIPTION

Figure 1:
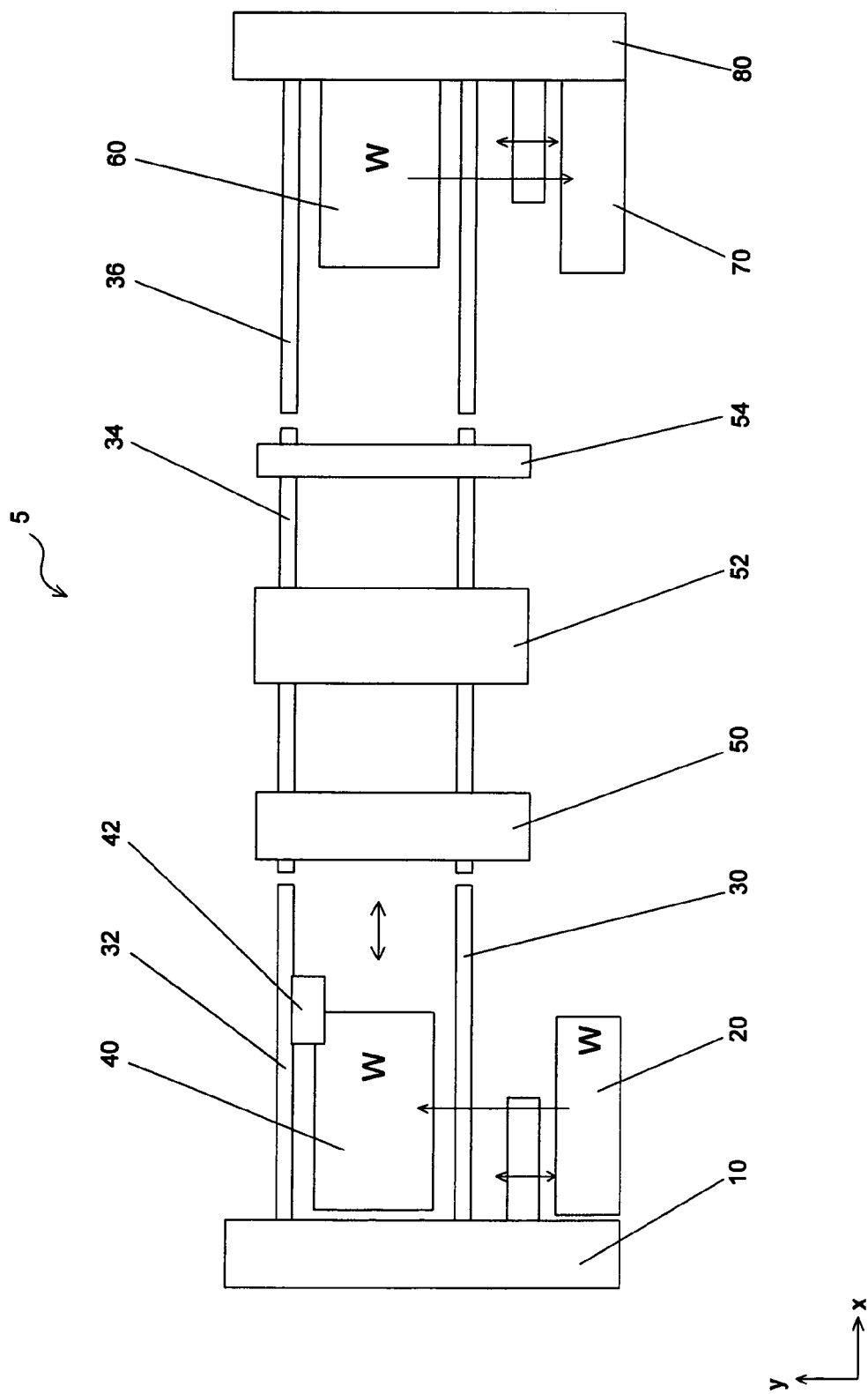
FIG. 1 illustrates a typical laser marking machine in block diagrams for use in the manufacture of semiconductor integrated circuit packages.

One or more specific and alternative embodiments of the present invention will now be described with reference to the attached drawings. It shall be apparent to one skilled in the art, however, that this invention may be practised without such specific details. Some of the details may not be described at length so as not to obscure the invention. For ease of reference, common reference numerals or series of numerals will be used throughout the figures when referring to the same or similar features common to the figures.

Figure 2:
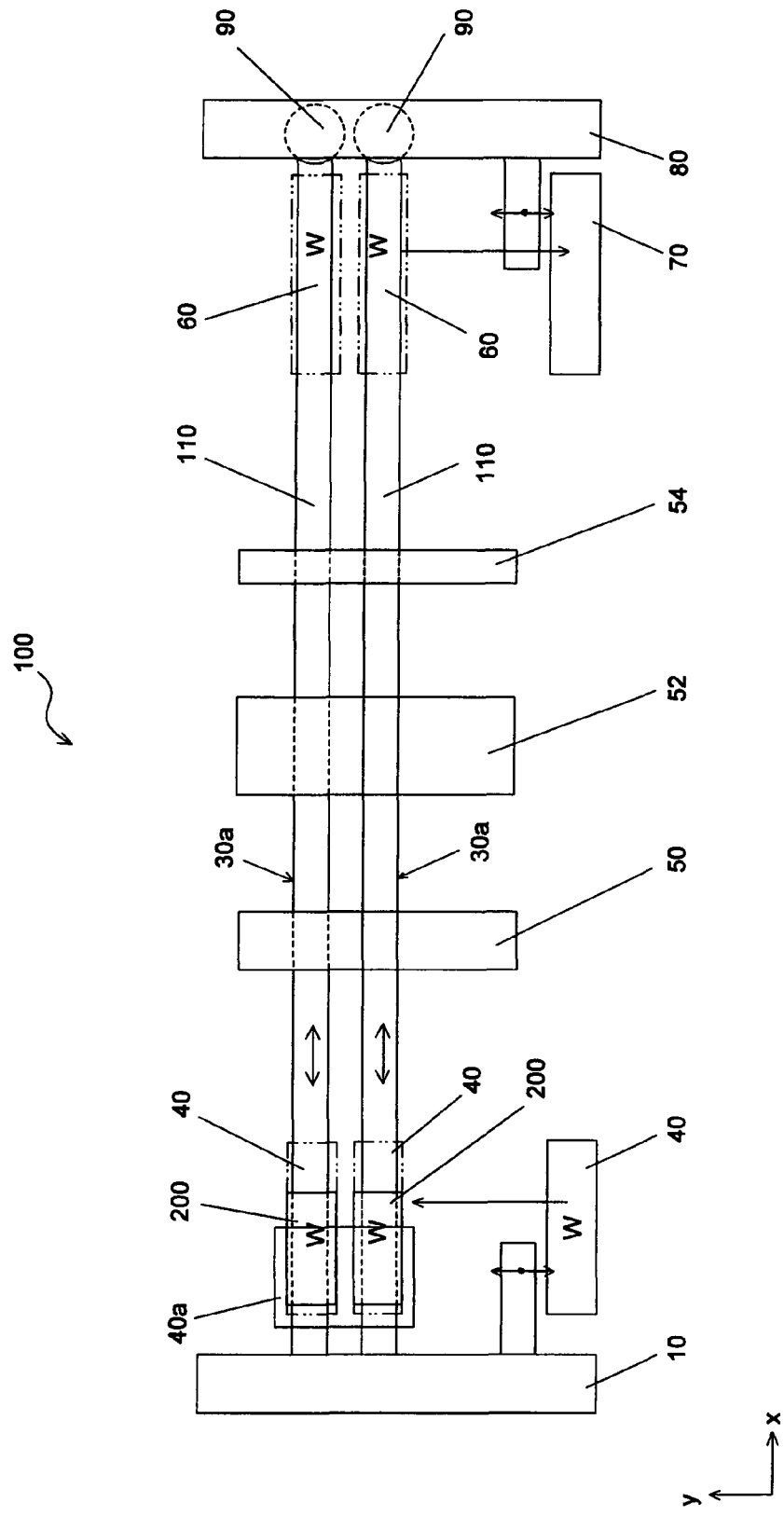
FIG. 2 shows a laser marking machine in block diagrams incorporating an adaptive clamp width adjusting device according to an embodiment of the present invention.

FIG. 2 shows a laser marking machine 100 in functional blocks incorporating an adaptive clamp width adjusting or setting device 200 for use in an integrated circuit package process machine according to an embodiment of the present invention. As shown in FIG. 2, the machine 100 is similar in functions to the previous machine 5 except that there are now two conveyors 30a in parallel. Each conveyor 30a carries a moveable or travel component 210 of the adaptive clamp width adjusting device 200. There are six stations or positions along the conveyors 30a. As seen in FIG. 2, on the left hand side of each conveyor 30a is an input station 40. To the left of the input station is a clamp-width-conversion station 40a, while at the extreme right is an output station 60. Intermediate to the input- and output-stations are the pre-marking-inspection station 50, laser-marking station 52 and post-marking-inspection station 54. To move the adaptive clamp width adjusting device 200 from station to station, each conveyor 30a has a motor 90 and linear drive. In other embodiments, other types of motor 90 and associated position feedback devices are used. For example, the motor 90 may be a servo motor; it may be coupled with a linear encoder for error detection and correction. The motor 90 may be a stepper motor coupled with linear and/or rotary encoders. In another embodiment, the motor 90 is a dc or ac motor coupled with linear and/or rotary encoders. In yet another embodiment, the motor 90 is a linear motor.

Figure 3:
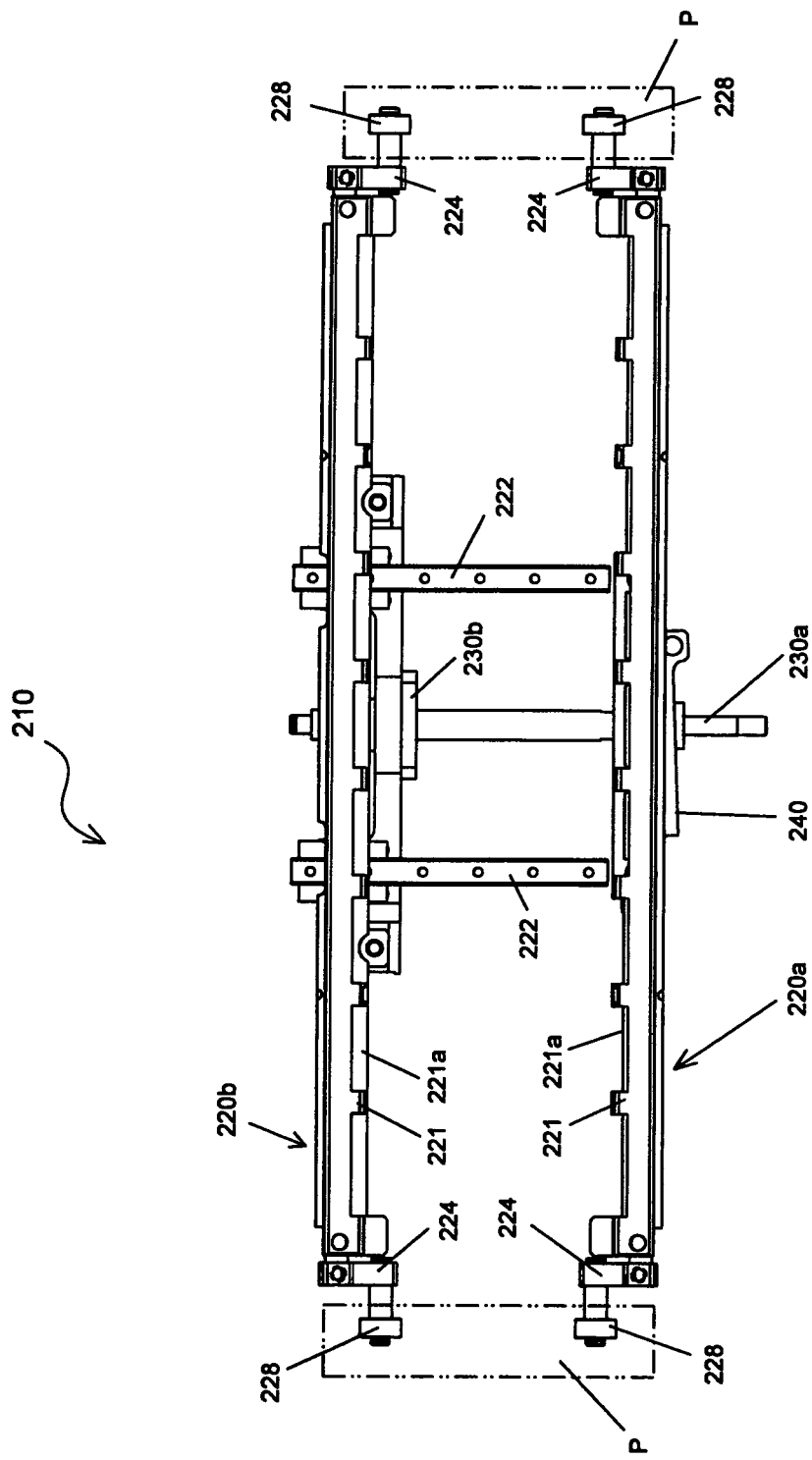
FIG. 3 shows a perspective view of a travel component of the adaptive clamp width adjusting device shown in FIG. 2.

FIG. 3 shows a perspective view of the travel component 210 according to an embodiment of the present invention. As shown in FIG. 3, the travel component 210 includes a clamp portion that is fixed 220a with respect to a longitudinal axis of the conveyor 110 and an adjustable clamp portion 220b. The adjustable clamp portion 220b is mounted on a pair of linear guides 222 so that the adjustable clamp and fixed clamp portions 220a,220b are parallel to each other and the distance between them is adaptive to a width of the IC package or strip W to be secured therebetween. As shown in FIG. 3, each of the two ends of the clamps 220a,220b has an L-shaped arm 224. One end of the L-shaped arm 224 is connected to operatively open a jaw 221 of each clamp 220a,220b whilst its free end has a roller 228. The lower sides of the rollers 228 on each end of the travel component 210 are arranged to fall within a horizontal plane that corresponds to an actuator plate P disposed in the input station 40 such that by raising the actuator plate P, the rollers 228 are mutually rotated upwards, thereby opening the associated clamping jaws 221. In the same way, a similar actuator plate P in the output station 60 is operable to open the clamping jaws 221. Each jaw 221 is biased to close against an associated support bar 221a that is fixed with respect to the travel component 210 by a resilient member (not shown in FIG. 3). In an embodiment, the resilient member is a tension spring. In another embodiment, the resilient member is a compression spring. In yet another embodiment, the resilient member is a torsion spring.

Figure 5A:
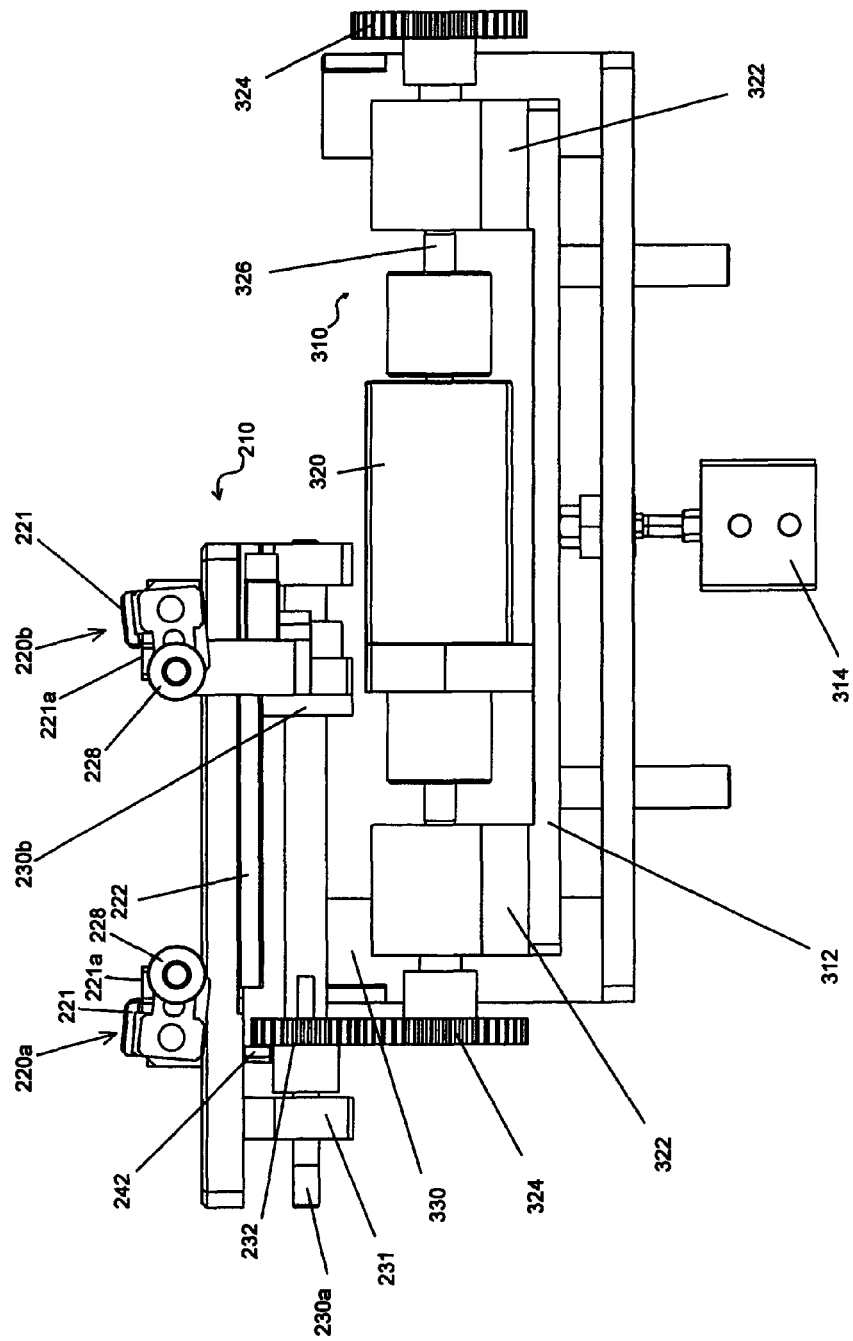
FIG. 5A shows a lateral cross-sectional view of the adaptive clamp width adjusting device when the travel and fixed components are engaged.
Figure 5B:
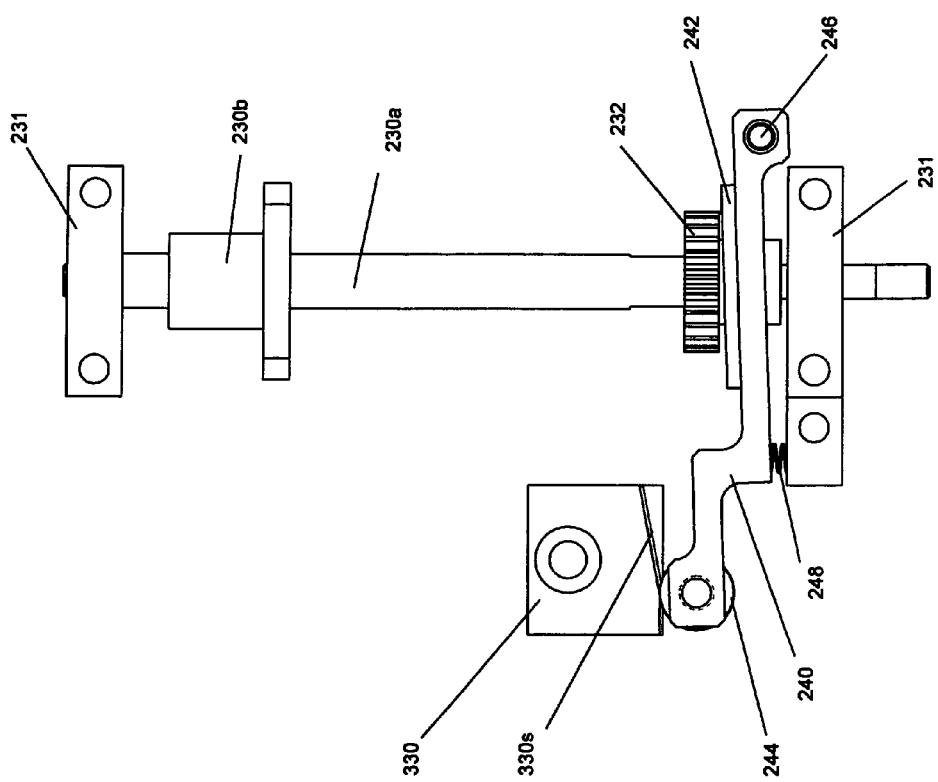
FIG. 5B shows a plan view of the drive and brake mechanisms of the adaptive clamp width adjusting device.

Referring to FIGS. 3, 5A and 5B, the adjustable clamp portion 220b is moveable by a rotary screw-nut assembly 230. Both ends of the lead screw 230a are separately supported by a bearing 231 whilst the nut 230b is fixedly linked to the linear guides 222. As seen in FIG. 5B, the end of the rotary screw 230a, on the same side as the fixed clamp 220a, has a driven gear 232. Mounted on the end of the rotary screw 230a and on a near side of the gear 232 is a brake lever 240. The brake lever 240 is arranged such that a friction disk 242 is biasedly disposed between the brake lever 240 and the near side of the driven gear 232. One end of the brake lever 240 has a cam follower 244 whilst the opposite end is pivoted about a pin 246. At an intermediate position between the cam follower 244 and the pivot pin 246, the brake lever 240 is biased against the friction disk 242 by a compression spring 248. In one embodiment, the rotary screw 230a is a leadscrew. In another embodiment, the rotary screw 230a is a ballscrew.

Figure 4:
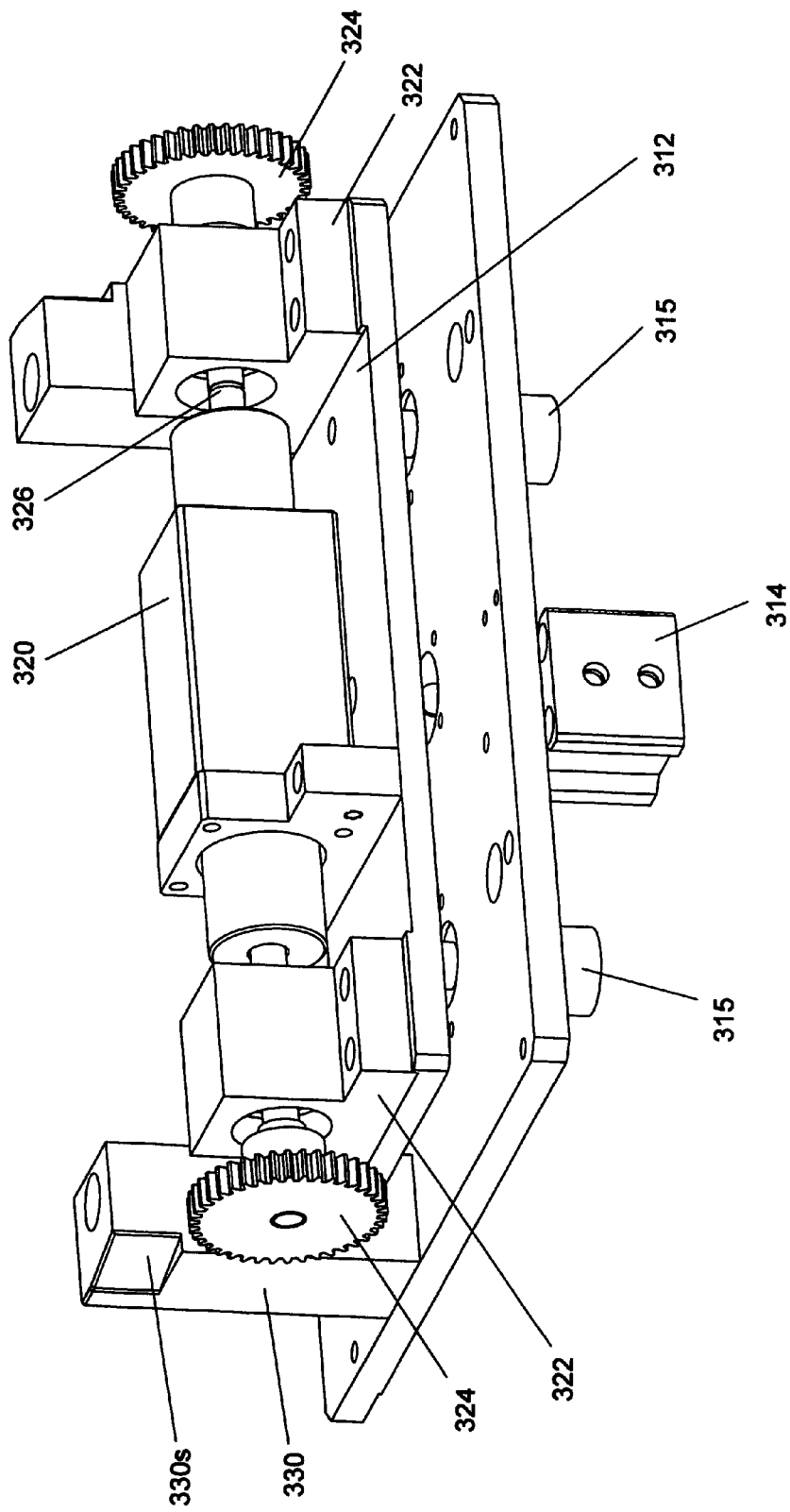
FIG. 4 shows a perspective view of a fixed component of the adaptive clamp width adjusting device shown in FIG. 2.

The fixed or drive component 310 of the adaptive clamp width adjusting device 200 is disposed in the clamp-width-conversion station 40a of the conveyor 110. As shown in FIG. 4, the fixed or drive component 310 is mounted on a base plate 312. The base plate 312 is operable to move from a home or retracted position to a conversion or extended position by means of linear actuators 314 and linear guides 315. Mounted on the base plate 312 are two bearing units 322 through which two separate drive gears 324 and associated shafts 326 are rotatable. A motor 320 with two in-line output shafts 326 are coupled to the respective drive gears 324 so that the motor 320, output shafts 326 and drive gears 324 form a common longitudinal axis that is parallel to the longitudinal axis of the rotary screw 230a on the travel component 210. Each drive gear 324 is substantially below the matching driven gear 232 on the travel component 210 when the clamp adjusting device 200 is moved into the clamp-width-conversion station 40a; the teeth of drive gears 324 and driven gears 232 are engaged when the base plate 312 is raised to its extended position by the actuators 314. At the same time, the cam follower 244 on the brake lever 240 has moved on a cam surface 330S of a release cam 330 located on the drive component 310 of the adaptive clamp width adjusting device 200, such that pressure exerted on the friction pad 242 is released and the motor 320 is then operable to turn the gears 232,324, thereby operative to adjust the distance between the adjustable clamp portion 220b and the fixed clamp portion 220a to accommodate another type of IC package W having a different width.

An advantage of the present invention is that the travel component 210 of the adaptive clamp width adjusting device 200 is operable to travel on the respective conveyor 110 without a motor mounted thereon. This means that the mass and inertia of the travel component 210 are smaller and this entails the use of a smaller drive motor 90 for the conveyor 110. In addition, an actuator plate P for opening jaws of the adaptive clamp width adjusting device 200 need only be provided at the input- and output-stations 40,60 associated with the respective conveyor 110. With the present invention, the mass and inertia of the moveable component 210 are lighter by at least the masses and inertias of the motor and actuator plates when compared to known devices. In addition, there is no need to provide a flexible cable carrier and cable for a motor on the travel component 210.

Another advantage of the present invention is that the drive component 310 uses one motor 320 to drive two gears 324. With this invention, two conveyors 110 are operable in parallel, and any idle time of the IC package processing machine is reduced; as a result, the machine throughput (in terms of units handled per hour) and productivity are increased.

In another embodiment of the adaptive clamp width adjusting device 200, the drive gears 324 and driven gear 232 are made of matching friction wheels. In one embodiment, the friction wheel is made of a material that is non-slip, such as, an elastomer. In another, the friction wheel is made up of a solid material but the contact surface is coated with or covered by a non-slip material. In another embodiment, the friction wheel has a non-slip band on the contact surface. In yet another embodiment, only one friction wheel has such a non-slip coating, surface or band.

Other embodiments of the friction brake are also possible. For example, in an embodiment, a tension spring is used instead of a compressing spring. In another embodiment, a torsion spring operable at the pivot pin 246 may be used.

While specific embodiments have been described and illustrated, it is understood that many changes, modifications, variations and combinations thereof could be made to the present invention without departing from the scope of the invention. For example, whilst a laser marking machine is described, the principle of the present invention may be used in an IC strip testing machine. In addition, the IC strip testing machine may be integrated with a laser marking machine. In another example, a leadscrew may be used in place of a ballscrew, or vice versa. In yet another example, a linear drive may be configured with a belt and pulley drive or a linear motor.

The invention claimed is:

1. An adaptive clamp width adjusting or setting device comprising:
    a travel component, which comprises a fixed clamp portion, an adjustable clamp portion and a rotary screw for adjusting a distance between the fixed and adjustable clamp portions, with the rotary screw being operable by a driven wheel attached to the rotary screw and a brake lever operatively biased against a face of the driven wheel; and
    a fixed component, which comprises a base plate and a motor mounted on the base plate, with the motor shaft having a drive wheel attached thereto;
    wherein, when the clamp width is to be adjusted to accommodate a workpiece, the travel component is moved into alignment over the fixed component and the base plate is raised so that the drive wheel engages with the driven wheel and the distance between the fixed and moveable clamp portions is operatively adjusted by controlling the motor according to a width of the workpiece.

2. A device according to claim 1, further comprising a friction disk disposed between the brake lever and the driven wheel.

3. A device according to claim 1, wherein one end of the brake lever is pivoted about a pin whilst an opposite end comprises a cam follower.

4. A device according to claim 3, wherein the base plate further comprises a release cam, which has a cam surface that is operative with the cam follower to release the friction brake on the driven wheel.

5. A device according to claim 1, wherein the drive and driven wheels are gear wheels.

6. A device according to claim 1, wherein the drive or driven wheel is a friction wheel.

7. A device according to claim 1, wherein the travel component is translated by a linear drive.

8. A device according to claim 7, wherein the linear drive comprises a motor coupled to any one of the following: leadscrew; ballscrew; or belt and pulley.

9. A device according to claim 8, wherein the motor is selected from the following: servo; stepper, dc or ac motor.

10. A device according to claim 7, wherein the linear drive is a linear motor.

11. A device according to claim 7, wherein the linear drive is further coupled with a linear and/or rotary encoder.

12. An integrated circuit process machine comprising an adaptive clamp width setting device according to claim 1.

13. A process machine according to claim 12 comprising an IC package laser marking machine and/or IC package testing machine.

* * * * *